United States Patent
Park et al.

(10) Patent No.: US 11,430,754 B2
(45) Date of Patent: Aug. 30, 2022

(54) SEMICONDUCTOR PACKAGE INCLUDING FRAME IN WHICH SEMICONDUCTOR CHIP IS EMBEDDED

(71) Applicant: SAMSUNG ELECTRO-MECHANICS CO., LTD., Suwon-si (KR)

(72) Inventors: Yong Jin Park, Suwon-si (KR); Sang Kyu Lee, Suwon-si (KR); Moon Il Kim, Suwon-si (KR); Myung Sam Kang, Suwon-si (KR); Jeong Ho Lee, Suwon-si (KR); Young Gwan Ko, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 424 days.

(21) Appl. No.: 16/554,278

(22) Filed: Aug. 28, 2019

(65) Prior Publication Data
US 2020/0411460 A1 Dec. 31, 2020

(30) Foreign Application Priority Data
Jun. 28, 2019 (KR) .................. 10-2019-0078011

(51) Int. Cl.
*H01L 23/495* (2006.01)
*H01L 23/00* (2006.01)
(Continued)

(52) U.S. Cl.
CPC .......... *H01L 24/09* (2013.01); *H01L 23/3142* (2013.01); *H01L 23/4952* (2013.01);
(Continued)

(58) Field of Classification Search
CPC . H01L 24/09; H01L 23/3142; H01L 23/4952; H01L 23/49534; H01L 23/49548;
(Continued)

(56) References Cited

U.S. PATENT DOCUMENTS 9,613,894 B2 * 4/2017 Hu ................. H01L 23/49827
10,381,309 B2 * 8/2019 Wang .............. H01L 25/0657
(Continued)

FOREIGN PATENT DOCUMENTS

JP 2013-197382 A 9/2013
KR 10-2010-0093357 A 8/2010

*Primary Examiner* — Caleb E Henry
*Assistant Examiner* — Dilinh P Nguyen
(74) *Attorney, Agent, or Firm* — Morgan, Lewis & Bockius LLP

(57) ABSTRACT

A semiconductor package includes a frame having a wiring structure and having a recess portion, a semiconductor chip having an active surface with a connection pad disposed thereon and disposed in the recess portion, an encapsulant sealing the semiconductor chip, and a redistribution layer having a first via connected to the connection and a second via connected to a portion of the wiring structure. The semiconductor chip includes a protective insulating film disposed on the active surface and having an opening exposing a region of the connection pad, and a redistribution capping layer connected to the region of the connection pad and extending onto the protective insulating film, and a surface of the redistribution capping layer is substantially the same level as a surface of the portion of the wiring structure, exposed from the first surface.

22 Claims, 12 Drawing Sheets

(51) Int. Cl.
*H01L 23/31* (2006.01)
*H01L 23/522* (2006.01)
*H01L 23/532* (2006.01)
*H01L 23/498* (2006.01)

(52) U.S. Cl.
CPC .. *H01L 23/49534* (2013.01); *H01L 23/49548* (2013.01); *H01L 23/49861* (2013.01); *H01L 23/5226* (2013.01); *H01L 23/53238* (2013.01); *H01L 2224/02372* (2013.01); *H01L 2224/02377* (2013.01); *H01L 2224/02379* (2013.01); *H01L 2924/01013* (2013.01)

(58) Field of Classification Search
CPC ........... H01L 23/49861; H01L 23/5226; H01L 23/53238; H01L 2224/02372; H01L 2224/02377; H01L 2224/02379; H01L 2924/01013
USPC ........................................................ 257/676
See application file for complete search history.

(56) References Cited

U.S. PATENT DOCUMENTS

| | | |
|---|---|---|
| 2013/0249075 A1 | 9/2013 | Tateiwa et al. |
| 2016/0233166 A1 | 8/2016 | Teh et al. |
| 2018/0076103 A1* | 3/2018 | Jeon ...................... H01L 25/105 |

* cited by examiner

SEMICONDUCTOR PACKAGE INCLUDING FRAME IN WHICH SEMICONDUCTOR CHIP IS EMBEDDED

CROSS-REFERENCE TO RELATED APPLICATION(S)

This application claims benefit of priority to Korean Patent Application No. 10-2019-0078011 filed on Jun. 28, 2019 in the Korean Intellectual Property Office, the disclosure of which is incorporated herein by reference in its entirety.

TECHNICAL FIELD

The present disclosure relates to a semiconductor package.

BACKGROUND

As the sizes of mobile displays increase, greater battery capacity is required. Since the area occupied by the battery may be increased due to an increase in battery capacity, a size of a printed circuit board (PCB) is required to be reduced. As a result, there is continuing interest in modularization, due to a reduction in a mounting area of components.

On the other hand, as a technology for mounting a plurality of components according to the related art, chip on board (COB) technology is exemplified. COB is a method of mounting individual passive components and semiconductor packages on a printed circuit board using surface mount technology (SMT).

SUMMARY

An aspect of the present disclosure is to provide a semiconductor package having a redistribution layer structure with excellent reliability.

According to an aspect of the present disclosure, a semiconductor package includes: a frame having a first surface and a second surface opposing each other, including an insulating member and a wiring structure disposed in the insulating member and connecting the first and second surfaces to each other, and having a recess portion open toward the first surface; a semiconductor chip having an active surface with a connection pad disposed thereon and an inactive surface opposite to the active surface, the inactive surface disposed on a bottom surface of the recess portion such that the active surface opposes the first surface; an encapsulant sealing the semiconductor chip disposed in the recess portion, and covering the first surface of the frame; and a redistribution layer disposed on a surface of the encapsulant, and having a first via electrically connected to the connection pad of the semiconductor chip and a second via connected to a portion of the wiring structure, exposed from the first surface. The semiconductor chip includes a protective insulating film disposed on the active surface and having an opening exposing a region of the connection pad, and a redistribution capping layer connected to the region of the connection pad and extending onto the protective insulating film, the first via is connected to an extending portion of the redistribution capping layer on the protective insulating film, and a surface of the redistribution capping layer is substantially the same level as a surface of the portion of the wiring structure, exposed from the first surface.

According to another aspect of the present disclosure, a semiconductor package includes: a frame having a first surface and a second surface opposing each other, including a plurality of insulating layers, a plurality of wiring layers disposed in the plurality of insulating layers, respectively, and a plurality of wiring vias electrically connecting the plurality of wiring layers while passing through the plurality of insulating layers, and having a recess portion open to the first surface; a semiconductor chip having an active surface with a connection pad disposed thereon and an inactive surface opposite to the active surface, the inactive surface disposed on a bottom surface of the recess portion such that the active surface opposes the first surface; a first encapsulant sealing the semiconductor chip disposed in the recess portion, and covering the first surface of the frame; a redistribution layer disposed on a surface of the first encapsulant, and having a first via electrically connected to a connection pad of the semiconductor chip and a second via connected to a wiring layer, located in the first surface, among the plurality of wiring layers; a plurality of passive components disposed in the second surface of the frame, and electrically connected to the plurality of wiring layers; and a second encapsulant disposed on the second surface of the frame to seal the plurality of passive components. The semiconductor chip includes a protective insulating film disposed on the active surface and having an opening exposing a region of the connection pad, and a redistribution capping layer connected to the region of the connection pad and extending onto the protective insulating film, the first via is connected to a portion of the redistribution capping layer on the protective insulating film, and the first via and the second via have substantially the same height.

Other features and aspects will be apparent from the following detailed description, the drawings, and the claims.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
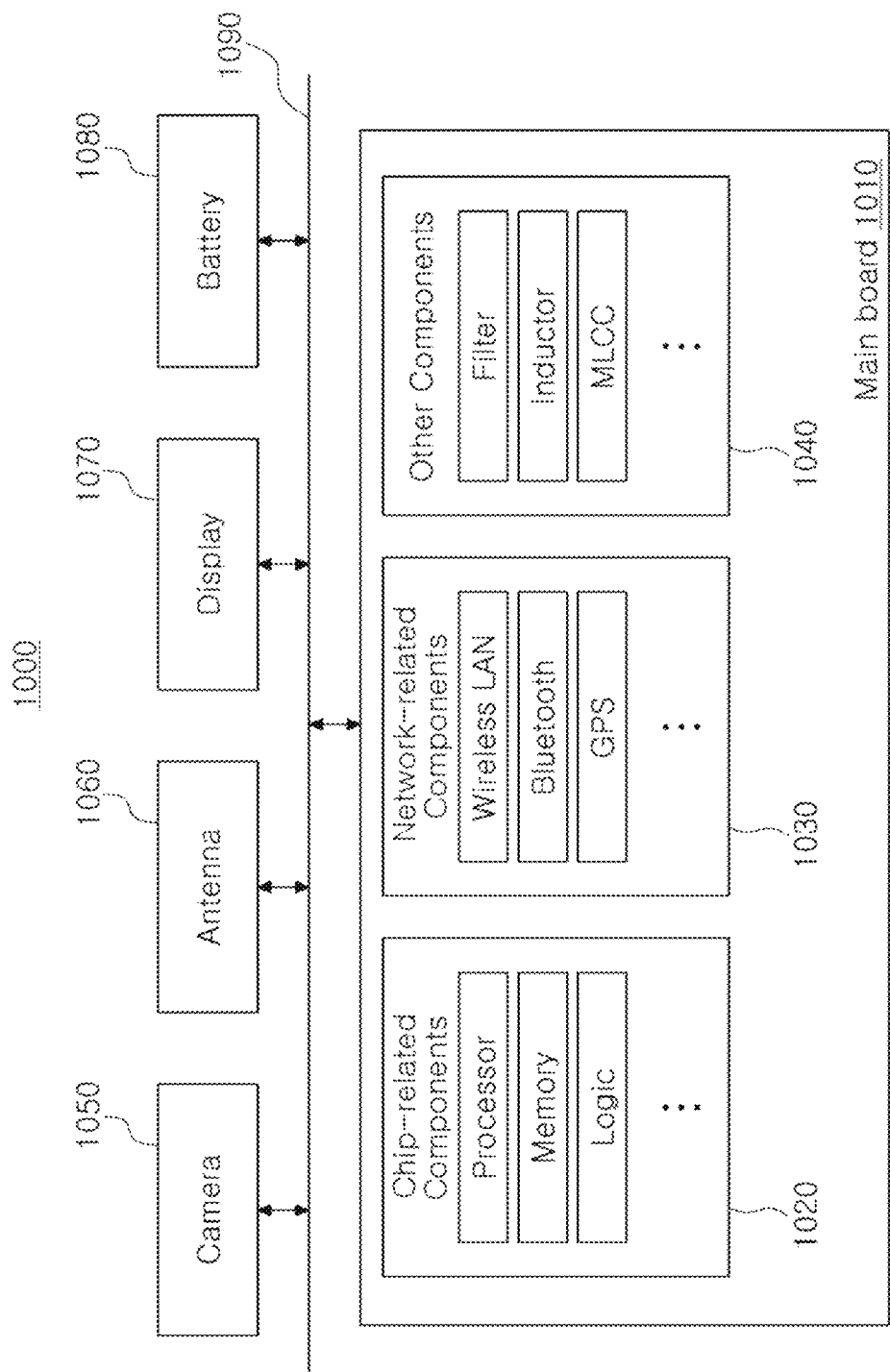
FIG. 1 is a schematic block diagram illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape resulting from manufacturing. The following embodiments may also be constituted by one or a combination thereof.

The contents of the present disclosure described below may have a variety of configurations and propose only a required configuration herein, but are not limited thereto.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip associated components 1020 or the network associated components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

2 is a schematic perspective view illustrating an example of an electronic device.

Figure 2:
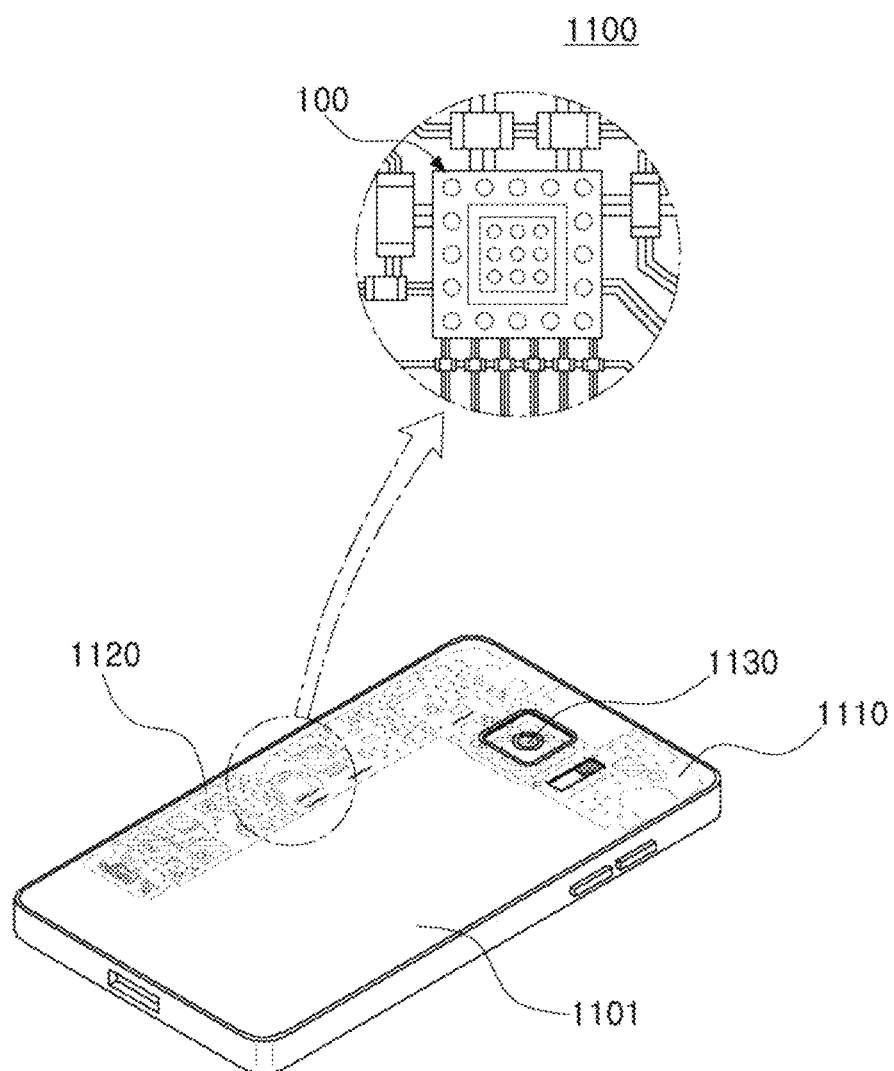
FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the main board 1010, such as a camera module 1130, may be accommodated in the body 1101. Some of the electronic components 1120 may be chip related components, and a semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
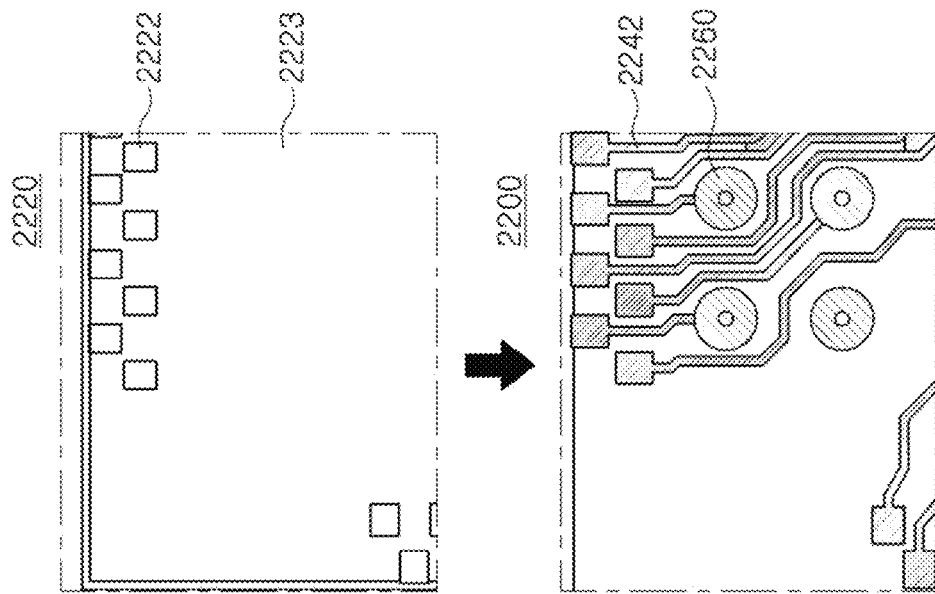
FIGS. 3A and 3B are schematic cross-sectional views illustrating states of a fan-in semiconductor package before and after being packaged.
Figure 3A:
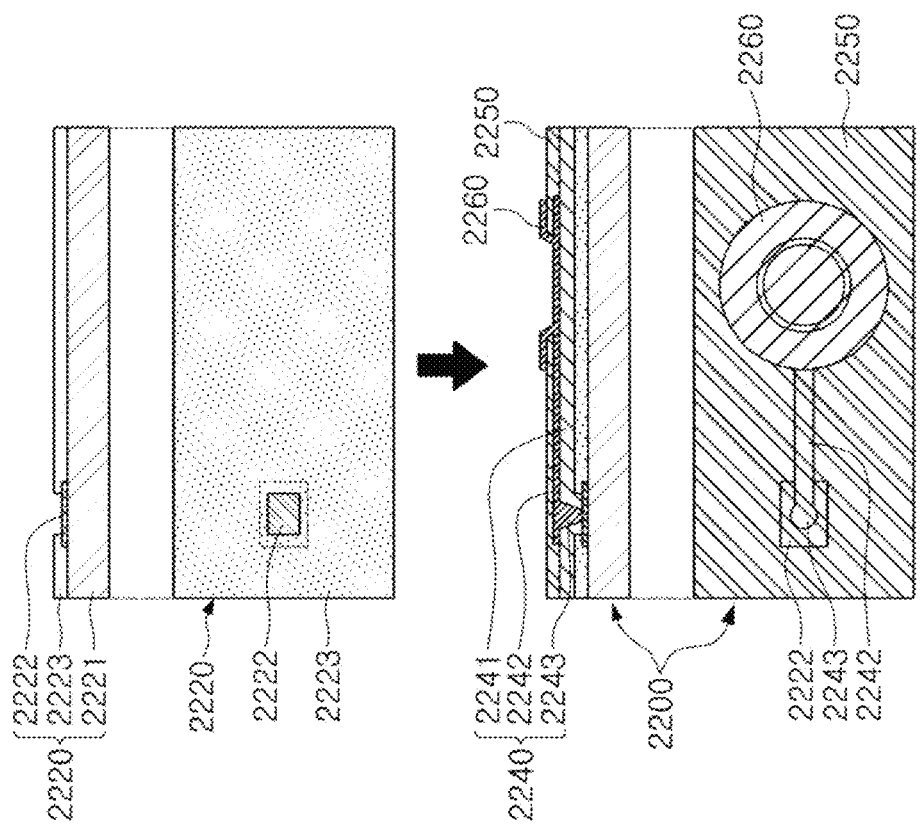
Figure 4:
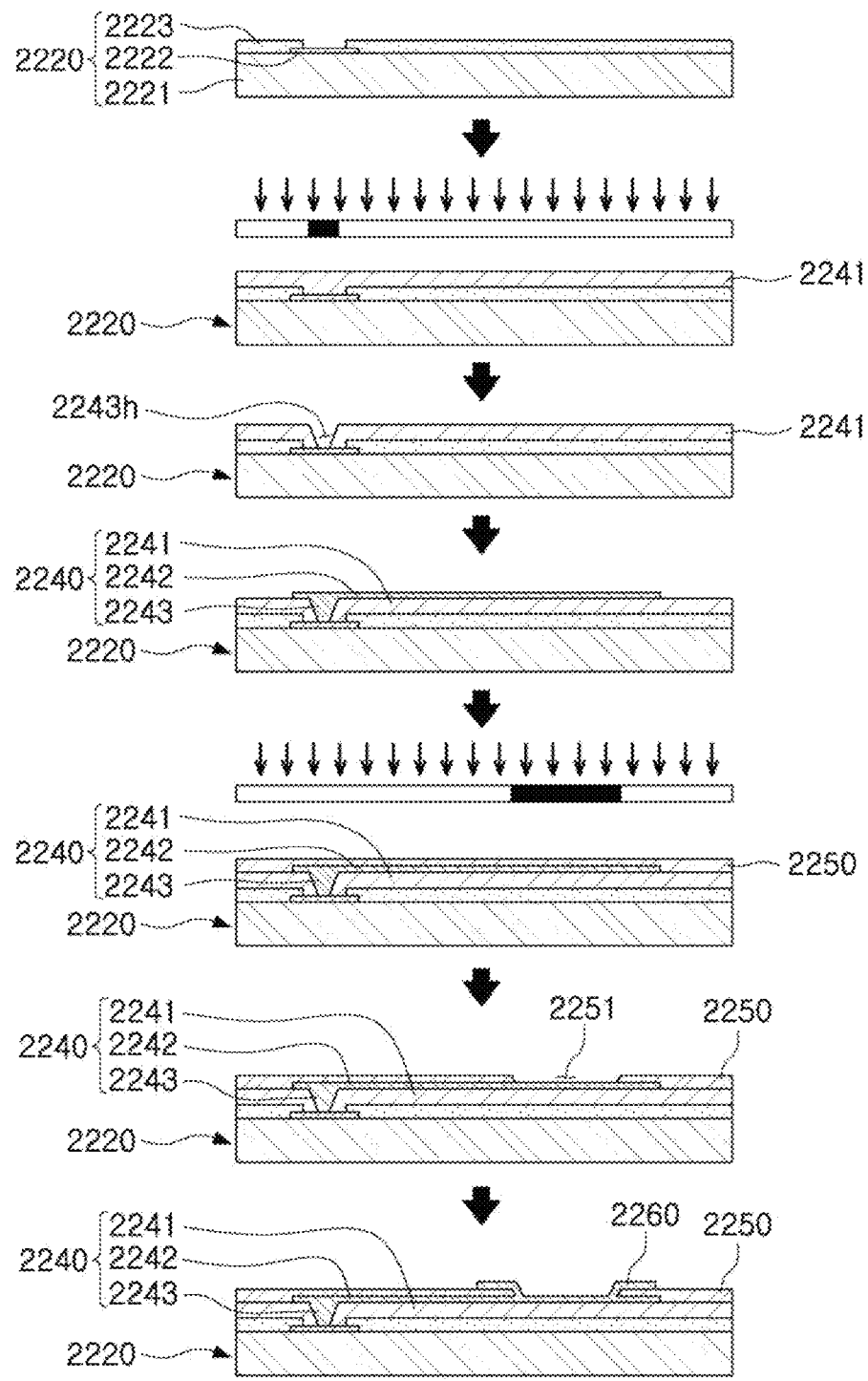
FIG. 4 is schematic cross-sectional views illustrating a packaging process of a fan-in semiconductor package.

FIGS. 3A and 3B are schematic cross-sectional views illustrating states of a fan-in semiconductor package before and after being packaged, and FIG. 4 are schematic cross-sectional views illustrating a packaging process of a fan-in semiconductor package.

Referring to FIGS. 3A, 3B, and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimagable dielectric (PID) resin, forming via holes 2243 opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. Here, even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
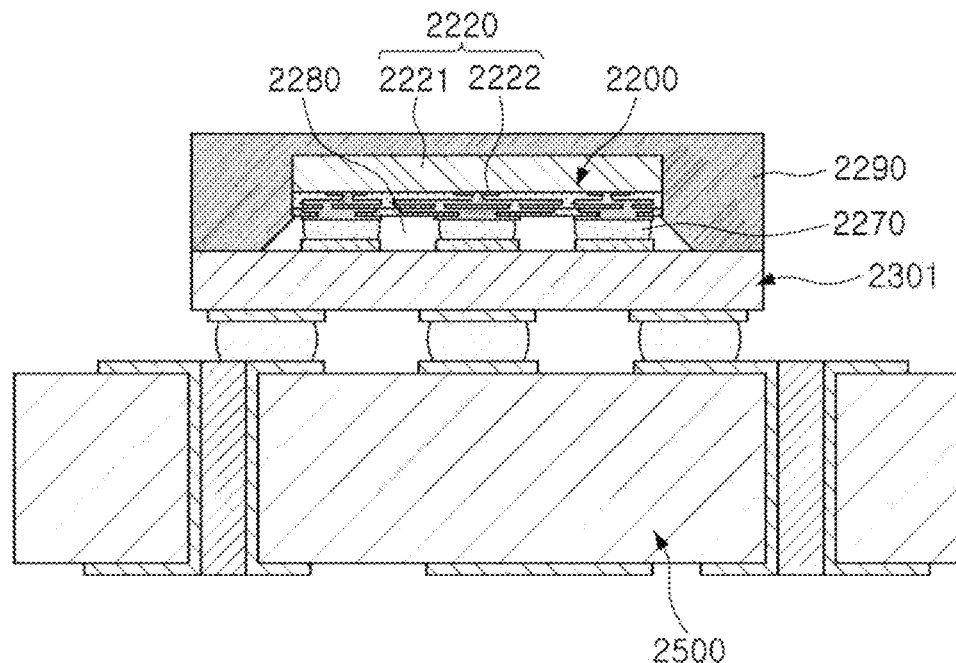
FIG. 5 is a schematic cross-sectional view illustrating a case in which a fan-in semiconductor package is mounted on an interposer substrate and is ultimately mounted on a mainboard of an electronic device.
Figure 6:
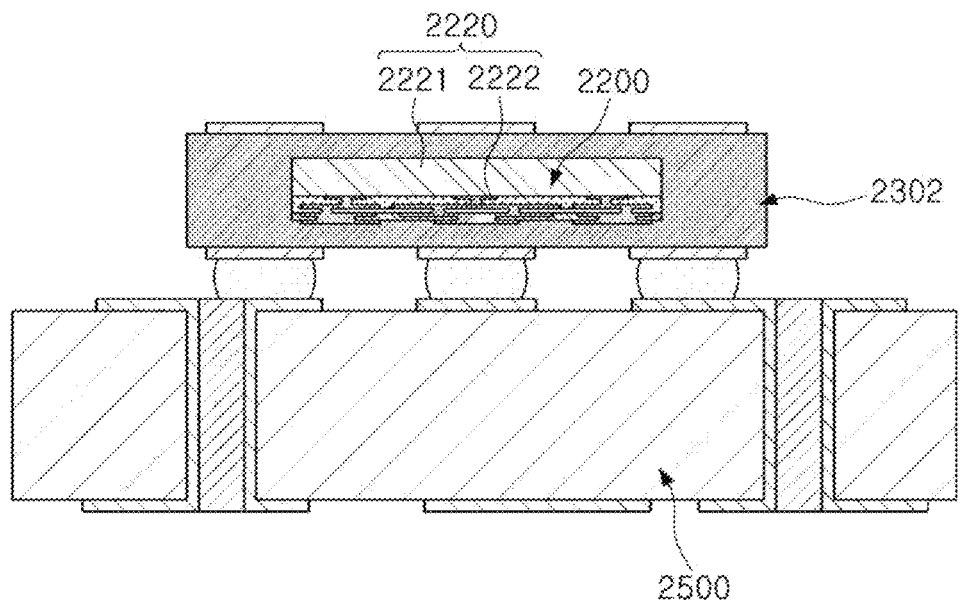
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may ultimately be mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
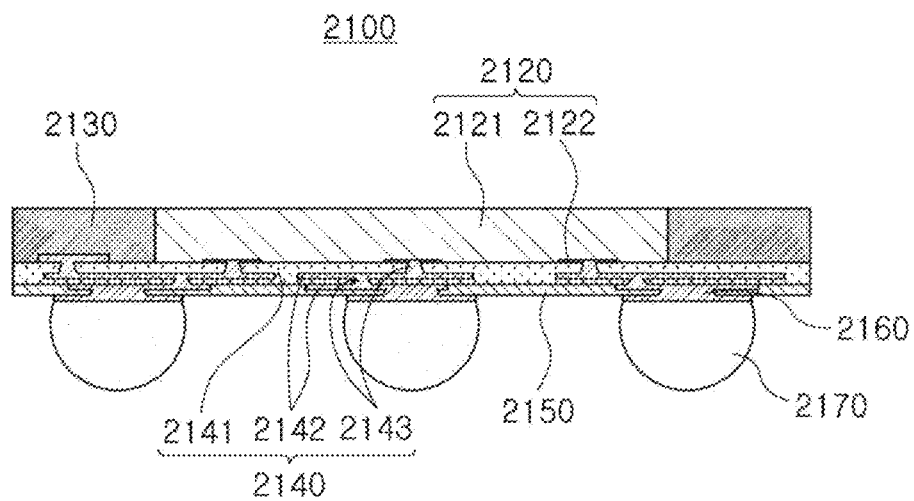
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2202 may further be formed on the connection structure 2140, and an underbump metal layer 2160 may further be formed in openings of the passivation layer 2202. Solder balls 2170 may further be formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

In the manufacturing process described above, after the encapsulant 2130 is formed outside of the semiconductor chip 2120, the connection structure 2140 may be provided. In this case, a process is performed on the connection structure 2140 from a via and a redistribution layer, connected to a connection pad 2122 of a semiconductor chip 2120, so the via 2143 may be formed to have a width smaller toward a semiconductor chip (see an enlarged area).

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
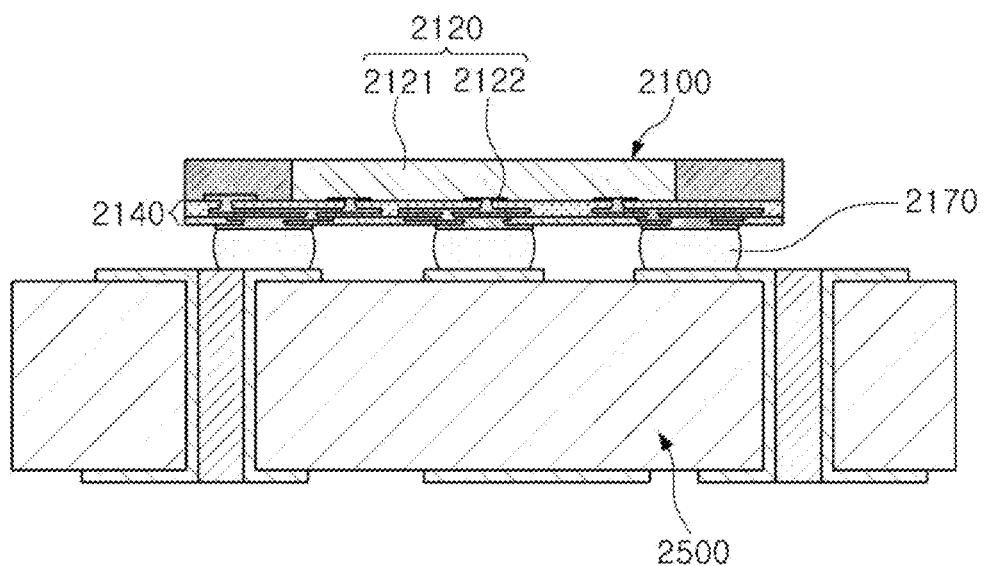
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, various exemplary embodiments of the present disclosure will be described in more detail with reference to the attached drawings.

Figure 9:
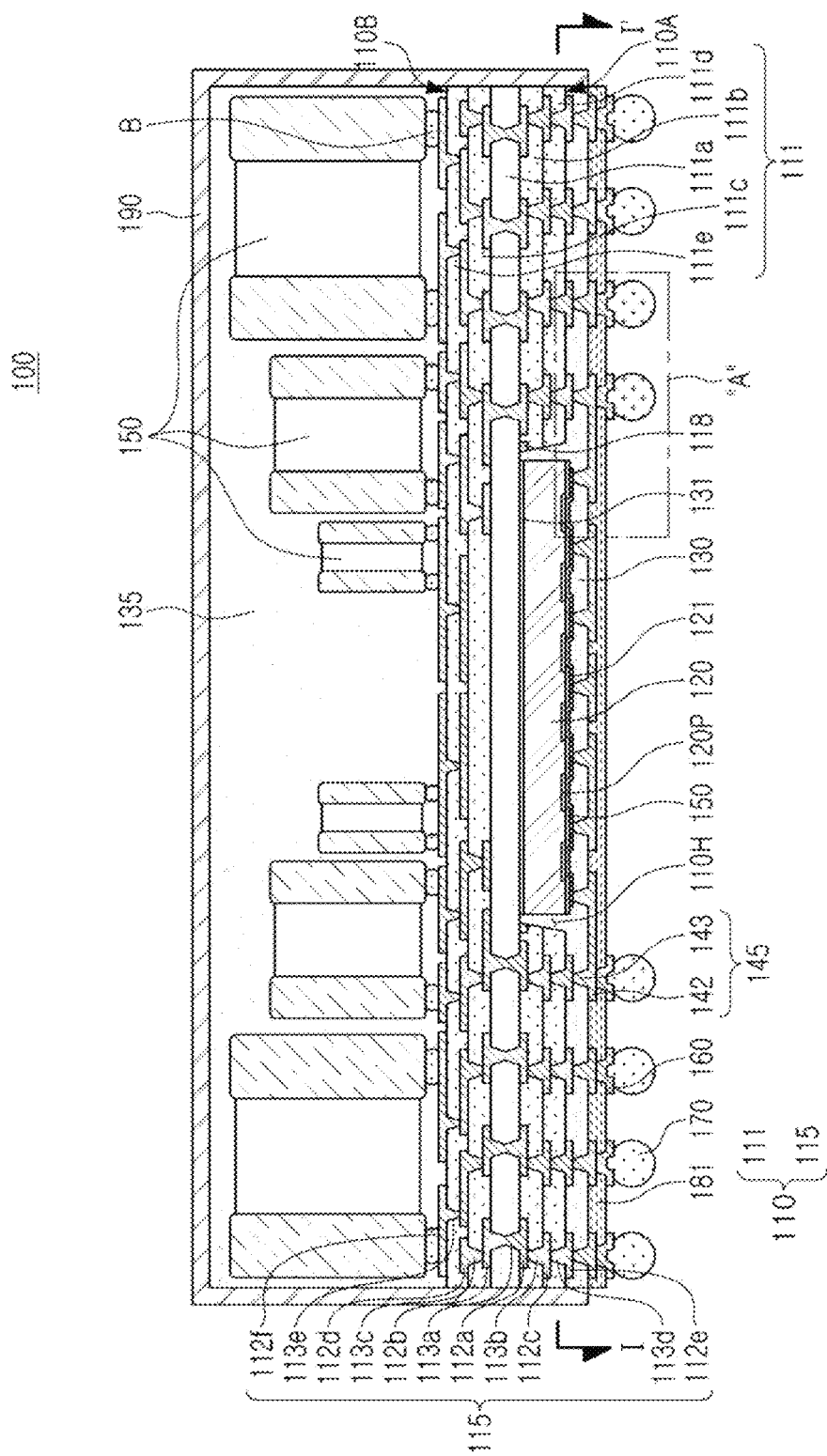
FIG. 9 is a schematic cross-sectional view of a semiconductor package according to an embodiment.
Figure 10:
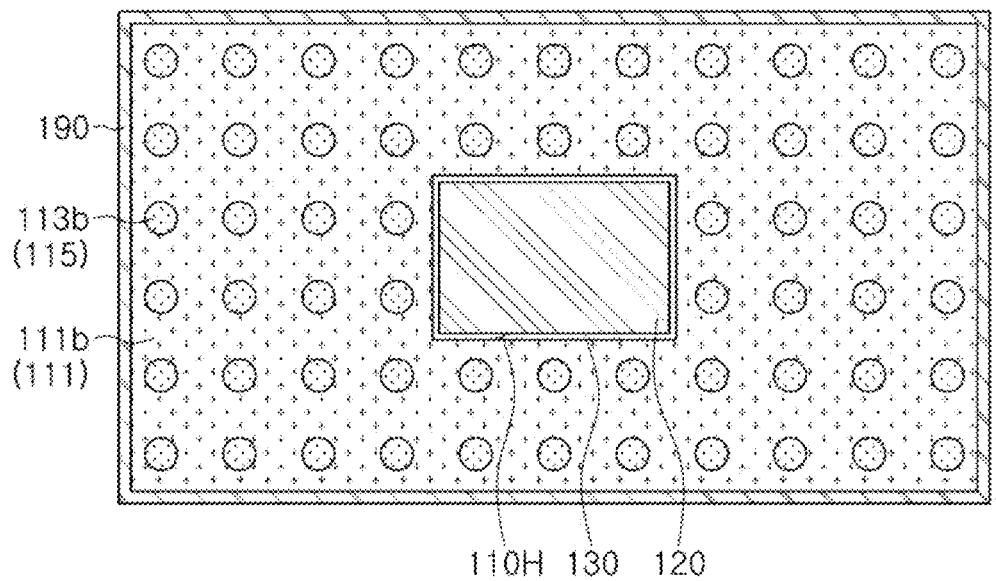
FIG. 10 is a plan view of the semiconductor package of FIG. 9 taken along line I-I'.

FIG. 9 is a schematic cross-sectional view of a semiconductor package according to an embodiment of the present disclosure, and FIG. 10 is a plan view of the semiconductor package of FIG. 9 taken along line I-I'.

Referring to FIGS. 9 and 10, a semiconductor package 100 according to an embodiment includes a frame 110 having a first surface 110A and a second surface 110B, opposing each other, and having a recess portion 110H open toward the first surface 110A, a semiconductor chip 120 having an active surface with a connection pad 120P disposed thereon and disposed on a bottom surface of the recess portion 110H so that the active surface opposes the first surface 110A, a first encapsulant 130 sealing the semiconductor chip 120 disposed in the recess portion 110H and covering the first surface 110A of the frame 110, and a redistribution layer 145 disposed in a surface of the first encapsulant 130 and electrically connected to the connection pad 120P of the semiconductor chip 120.

The frame 110 includes an insulating member 111 and a wiring structure 115 disposed in the insulating member 111, and connecting the first and second surfaces 110A and 110B. The redistribution layer 145 is electrically connected to the wiring structure 115 in the first surface 110H of the frame 110, and electrically connects the wiring structure 115 to the semiconductor chip 120.

The semiconductor package 100 may further include a plurality of passive components 150 disposed on the second surface 110B of the frame 110, and electrically connected to the wiring structure 115.

The redistribution layer 145 includes a redistribution pattern 142 disposed on a surface of the first encapsulant 130 and a redistribution via 143 connected to the redistribution pattern 142, and passing through a portion of the first encapsulant 130.

Figure 11:
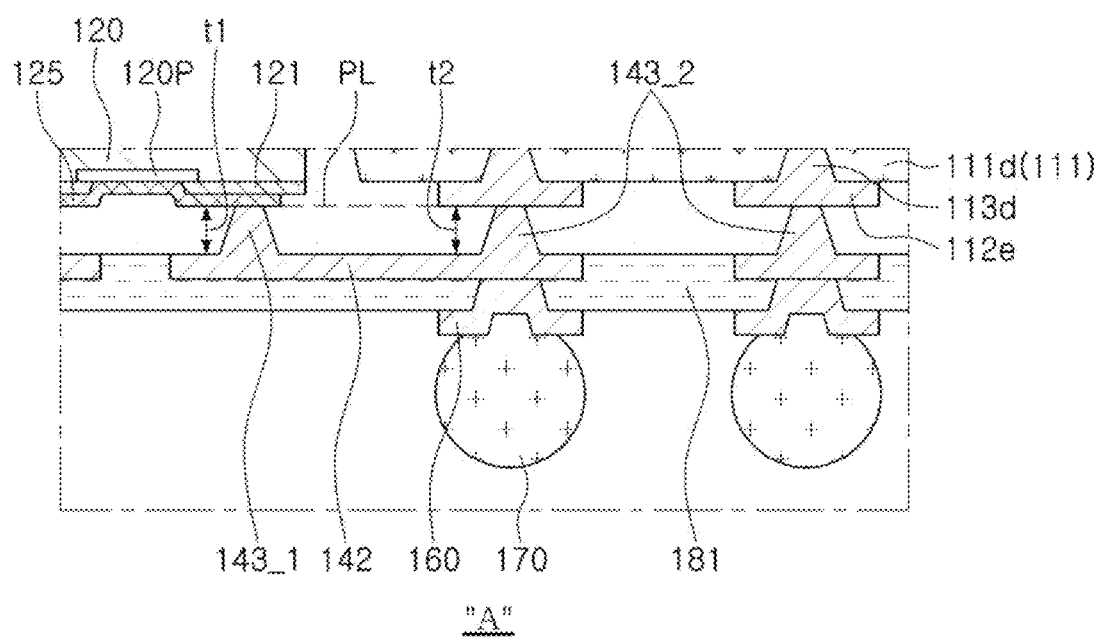
FIG. 11 is an enlarged cross-sectional view illustrating region "A" of the semiconductor package of FIG. 9.

FIG. 11 is an enlarged cross-sectional view illustrating region "A" of the semiconductor package of FIG. 9. As illustrated in FIG. 11, the redistribution via 143 may include a first via 143_1 electrically connected to a connection pad 120P of the semiconductor chip 120 and a second via 143_2 connected to a portion of the wiring structure 115 exposed to the first surface 110A.

The semiconductor chip 120 may include a protective insulating film 121 disposed on the active surface and opening a region of the connection pad 120P, and a redistribution capping layer 125 connected to a region of the connection pad 120P and extending from the protective insulating film 121. For example, the connection pad 120P includes aluminum (Al), while the redistribution capping layer 125 includes copper (Cu).

The first encapsulant 130 may be disposed to cover the active surface of the semiconductor chip 120 and the first surface 110A of the frame 110. A portion of the first encapsulant 130, located on the active surface of the semiconductor chip 120, may expose a region of the redistribution capping layer 125, and the first via 143_1 may be directly connected to the redistribution capping layer 125 through the exposed region. For example, the first via 143_1 may be directly connected the extending portion of the redistribution capping layer 125 disposed directly on the protective insulating film 121. Through the connection described above, the first via 143_1 of the redistribution layer 145 may be electrically connected to the connection pad 120P of the semiconductor chip 120.

A contact region is arranged on the protective insulating film 121 using the redistribution capping layer 125 of the semiconductor chip 120. Thus, a first via 143_1, electrically connected to the connection pad 120P of the semiconductor chip 120, embedded by the first encapsulant 130, may be formed using a simple process without an additional polishing process. For example, a hole for the first via 143_1 may be formed by laser drilling. As described above, the redistribution layer 145 may be easily formed using a printed circuit board process according to the related art, rather than a photolithography process.

The redistribution capping layer 125 of the semiconductor chip 120 may have a surface PL having substantially the same level as a surface of a portion of the wiring structure 115, exposed to the first surface 110A.

The frame 110 includes an insulating member 111 in which a plurality of insulating layers 111a, 111b, 111c, 111d, and 111e are stacked, while the wiring structure 115 may include a plurality of wiring patterns 112a, 112b, 112c, 112d, 112e, and 112f, formed in the plurality of insulating layers 111a to 111e, and a plurality of wiring vias 113a, 113b, 113c, 113d, and 113e, connected to the plurality of wiring patterns 112a to 112f, respectively, while passing through the plurality of insulating layers 111a to 111e.

In an embodiment, the plurality of insulating layers include a first insulating layer 111a, second and fourth insulating layers 111b and 111d, sequentially arranged on one side of the first insulating layer 111a, and third and fifth insulating layers 111c and 111e, sequentially arranged on the other side of the first insulating layer 111a.

The wiring structure 115, employed in an embodiment, has a six level wiring structure. In detail, the wiring structure 115 may include first and second wiring patterns 112a and 112b disposed on both sides of the first insulating layer 111a, respectively, third and fifth wiring patterns 112c and 112e disposed on the second and fourth insulating layers 111b and 111d, respectively, fourth and sixth wiring patterns 112d and 112f disposed on the third and fifth insulating layers 111c and 111e, respectively, a first wiring via 113a passing through the first insulating layer 111a to connect the first and second wiring patterns 112a and 112b, a second wiring via 113b passing through the second insulating layer 111b to connect the first and third wiring patterns 112a and 112c, a third wiring via 113c passing through the third insulating layer 111c to connect the second and fourth wiring patterns 112a and 112c, a fourth wiring via 113d passing through the fourth insulating layer 111d to connect the third and fifth wiring patterns 112c and 112e, and a fifth wiring via 113e passing through the fifth insulating layer 111e to connect the fourth and sixth wiring patterns 112d and 112f.

In an embodiment, the recess portion 110H may be provided by removing a portion of the second and fourth insulating layers 111b and 111d, and a bottom surface of the recess portion 110H may be provided as a portion of one side of the first insulating layer 111a. A structure and a depth of the recess portion 110H are not limited thereto. A stopper layer 118 may be disposed in a bottom surface of the recess portion 110H, and may only remain in the first insulating layer 111a and the second insulating layer 111b around the bottom surface of the recess portion 110H. The stopper layer 118 is disposed between the first and second insulating layers 111a and 111b to control a depth of a recess portion when the recess portion 110H is formed. The active surface of the semiconductor chip 120 may be bonded to a bottom surface of the recess portion 110H by a bonding layer 131.

In an embodiment, a portion of the wiring structure, exposed to the first surface 110A, has a structure protruding from the first surface 110A. In detail, as illustrated in FIG. 11, a portion of the wiring structure 115, exposed to the first surface 110A, may be a fifth wiring pattern 112e.

As described above, a surface PL of the fifth wiring pattern 112e is substantially with the same level as a surface of the redistribution capping layer 125 of the semiconductor chip 120. In this case, a height t1 of the first via 143_1 connected to the redistribution capping layer 125 may be substantially the same as a height t2 of the second via 143_2 connected to the fifth wiring pattern 112e. Thus, as a first encapsulant 130 is processed (for example, a laser drilling process) to a predetermined depth for formation of the redistribution layer 145, holes for formation of desired first and second vias 143_1 and 143_2) may be easily formed.

The semiconductor package 100 according to an embodiment may further include a plurality of passive components 150 disposed on the second surface 110B of the frame 110 and connected to the wiring structure 115. The plurality of passive components 150 may be connected to a portion of the sixth wiring pattern 112e by a bonding metal B. In some embodiments, an additional passivation layer (not illustrated) may be formed in the second surface 110B of the frame 110 to expose a portion of the sixth wiring pattern 112e.

The semiconductor chip 120 and the plurality of passive components 150 may be electrically connected to each other through the wiring structure 115. It is illustrated that the plurality of passive components 150 are mounted on the second surface 110B of the frame 140 using, for example, surface mount technology (SMT), but an embodiment is not limited thereto. Alternatively, the plurality of passive components may be connected by a wire.

As described above, in the packages according to the related art, a semiconductor chip and an electronic component such as a passive component are arranged side by side. In this case, a space is required to place each component, so there may be a problem in which a size of a package, particularly, an area on the plane is increased. Moreover, when the passive component 150 is sealed by the first encapsulant 130 together with the semiconductor chip 120, it is difficult to replace a passive component during debugging, so there is difficulty in characteristic tuning.

On the other hand, in the semiconductor package 100 according to an embodiment, a semiconductor chip 120 and a plurality of passive components 150 may be separately arranged. In detail, a plurality of passive components 150 are mounted on the second surface 110B of the frame 110, opposite to a surface on which the semiconductor chip 120 is mounted, and at least a portion of the passive component 150 may be disposed to be overlapped with the semiconductor chip 120 on a plane. Thus, a size of the semiconductor package 100 may be reduced. The passive components 150 may have different thicknesses. As described above, the semiconductor package 100 has the advantageous in that the semiconductor chip 120 is sealed using the first encapsulant 130, the passive component 150 is mounted thereon, and a test or debugging may be performed on the passive component 150.

The semiconductor package 100 according to an embodiment may further include a second encapsulant 135 sealing a plurality of passive components 150, and a shielding metal layer 190 covering an upper surface and a side surface of the second encapsulant 135. The shielding metal layer 190 covers an upper surface and a side surface of the second encapsulant 135, and may extend to a portion of the side surface of the frame 110. The shielding metal layer 190 may be connected to a portion (for example, a ground region) of the wiring structure 115 in an area not illustrated, and thus a ground signal may be applied from the frame 110. However, an embodiment is not limited thereto. Due to the shielding metal layer 190, an EMI shielding function of the semiconductor package 100 may be further improved. The shielding metal layer 190 may include a metallic material such as copper (Cu), aluminum (Al), silver (Ag), tin (Sn), gold (Au), nickel (Ni), lead (Pb), titanium (Ti), or alloys thereof.

The respective components included in the semiconductor package 100 according to the embodiment will hereinafter be described in more detail.

The frame 110 may improve rigidity of the semiconductor package 100 depending on certain materials of an insulating member 111, and serve to secure uniformity of a thickness of the first encapsulant 130. The frame 110 may have a recess portion 110H formed in each of the second and fourth insulating layers 111b and 111d. The semiconductor chip 120 is disposed in the recess portion 110H, and a passive component (not illustrated) may be disposed together in some embodiments. The recess portion 110H may have a form with a wall surface surrounding the semiconductor chip 120, but is not limited thereto.

The wiring structure 115 of the frame 110, employed in an embodiment, may have a six level wiring structure, as described above, but various other structures (see FIGS. 13 and 15) in addition to another number of layers may be applied thereto.

A material of the insulating member 111, as a core insulating layer, is not limited thereto. For example, an insulating material may be used as the material of the core insulating layer. In this case, the insulating material may be a thermosetting resin such as an epoxy resin, a thermoplastic resin such as a polyimid resin, or a resin in which the thermosetting resin or the thermoplastic resin is mixed with an inorganic filler, for example, an Ajinomoto build-up film (ABF), or the like. Alternatively, the insulating material may be a material in which the thermosetting resin or the thermoplastic resin is impregnated together with an inorganic filler in a core material such as a glass fiber (or a glass cloth or a glass fabric), for example, a prepreg. In some embodiments, a PID resin may also be used as the encapsulant.

The first insulating layer 111a may have a thickness greater than a thickness of each of the second insulating layer 111b to the fifth insulating layer 111e. The first insulating layer 111a may be basically relatively thick in order to maintain rigidity, and the second insulating layer 111b to the fifth insulating layer 111e may be introduced in order to form a larger number of wiring patterns 112c to 112f. The first insulating layer 111a may include an insulating material different from those of the second insulating layer 111b to the fifth insulating layer 111e. For example, the first insulating layer 111a may be, for example, prepreg including a core material such as a glass fiber, an inorganic filler, and an insulating resin, and the second insulating layer 111b and the third insulating layer 111c may be ABF or PID including an inorganic filler and an insulating resin. However, the materials of the first insulating layer 111a and the second to fifth insulating layers 111b to 111e are not limited thereto.

Similarly, the first wiring via 113a passing through the first insulating layer 111a may have a diameter greater than a diameter of each of the second to fifth vias 113b to 113e passing through the second to fifth insulating layers 111b to 111e, respectively. Moreover, the first wiring via 113a may have an hourglass shape or a cylindrical shape, while the third and fifth wiring vias 113c and 113e may have tapered shapes and the second and fourth wiring vias 113b and 113d may have tapered shapes tapered in a direction opposite with respect to a tapered direction of the third and fifth wiring vias 113c and 113e. A thickness of each of the first to sixth wiring patterns 112a to 112f may be greater than a thickness of each of the redistribution patterns 142a and 142b.

As described above, a material for formation of the wiring structure 115 may be a conductive material such as aluminum (Al), silver (Ag), tin (Sn), gold (Au), nickel (Ni), lead (Pb), titanium (Ti), or alloys thereof, in addition to copper (Cu). The first to sixth wiring patterns 112a to 112f perform various functions depending on designs of layers thereof. For example, the wiring patterns may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring patterns may include via pads, wire pads, pads for an electrical connection metal, and the like. The first to sixth wiring patterns 112a to 112f may be formed using a known plating process together with the first to fifth wiring vias 113a to 113e, and each may be formed of a seed layer and a conductor layer. A thickness of each of the first to sixth wiring patterns 112a to 112f may be greater than a thickness of each of the redistribution patterns 142.

The first to fifth wiring vias 113a to 113e may electrically connect the wiring patterns, formed on different layers, to each other, resulting in an electrical path in a vertical direction in the frame 110. Each of the first to fifth wiring vias 113a to 113e may be a via in a filled type, filled with a conductive material, or may be a via in a conformal type, in which a conductive material is formed along a wall surface of a via hole.

The semiconductor chip 120 may be an integrated circuit (IC) provided in an amount of several hundred to several million or more elements integrated in a single chip. In this case, the IC may be, for example, an application processor chip such as a central processor (for example, a CPU), a graphics processor (for example, a GPU), a digital signal processor, a cryptographic processor, a microprocessor, a microcontroller, or the like, but is not limited thereto. Here, the IC may be a Power Management IC (PMIC), a memory chip such as a volatile memory (e.g., DRAM), a non-volatile memory (e.g., ROM), a flash memory, or an analog-to-digital converter, or a logic chip such as an application-specific IC (ASIC).

The semiconductor chip 120 may be an integrated circuit in a bare state in which a separate bump or a wiring layer is not provided. However, it is not limited thereto, and the semiconductor chip may be a package-type integrated circuit, if necessary. The integrated circuit may be provided based on an active wafer. In this case, a base material of a body of the semiconductor chip 120 may be silicon (Si), germanium (Ge), gallium arsenide (GaAs), or the like. Various circuits may be formed on the body. The connection pads 120P may electrically connect the semiconductor chip 120 to other components. A material of each of the connection pads may be a conductive material such as aluminum (Al), or the like. A protective passivation layer 121 exposing the connection pad 120P may be formed on a body, and the protective passivation layer 121 may be an oxide layer, a nitride layer, or the like, or a double layer of an oxide layer and a nitride layer. An insulating layer (not illustrated), and the like, may also be further disposed in other required positions. Meanwhile, in the semiconductor chip 120, a side, on which connection pad 120P is disposed, is an active surface, and the opposite side is an inactive surface.

The first encapsulant 130 encapsulates the frame 110 and the semiconductor chip 120, and may fill at least a portion of the recess portion 110H. The first encapsulant 130 may include an insulating material. The insulating material may be a material containing an inorganic filler and an insulating resin, for example, a thermosetting resin such as an epoxy resin, a thermoplastic resin such as a polyimide, or a resin in which a reinforcement such as an inorganic filler is contained in the thermosetting resin or the thermoplastic resin, in detail, an Ajinomoto build-up film (ABF), an FR-4 resin, a bismaleimide triazine (BT) resin, a resin, or the like. Moreover, a molding material such as EMC or a photosensitive material, that is, a photo imageable encapsulant (PIE) may be used. In some embodiments, a material in which an insulating resin such as the thermosetting resin or the thermoplastic resin is impregnated in a core material such as an inorganic filler and/or a glass fiber (or a glass cloth or a glass fabric), may be used. An insulating layer (not illustrated) may be additionally disposed on an upper surface of the first encapsulant 130. The insulating layer may be formed of a material, the same as or similar to that of the first encapsulant 130, and may be, for example, an Ajinomoto build-up film (ABF).

The redistribution layer 145 may be configured to redistribute the connection pad 120P of the semiconductor chip 120. Several tens to several hundreds of connection pads 120P of the semiconductor chip 120 having various functions may be redistributed by the redistribution layer 145, and may be physically and/or electrically externally connected through the electrical connection metal 170 depending on functions. Although the redistribution layer 145 is illustrated as a single layer as described above, but may be provided as a plurality of layers (see FIG. 12).

The redistribution layer 145 may redistribute the connection pad 120P of the semiconductor chip 120 to be electrically connected to the electrical connection metal 170, and includes a redistribution pattern 142 and a via 143. A material of each of the redistribution patterns 142 may also be a conductive material such as copper (Cu), aluminum (Al), silver (Ag), tin (Sn), gold (Au), nickel (Ni), lead (Pb), titanium (Ti), or alloys thereof. The redistribution pattern 142 may also perform various functions depending on a design thereof. For example, the redistribution pattern may include ground (GND) patterns, power (PWR) patterns, signal (S) patterns, and the like. Here, the S pattern may include various signals except for a GND pattern, a PWR pattern, or the like, for example, data signals, or the like, and may include a via pad, a pad for an electrical connection metal, or the like.

The redistribution via 143 may be used to electrically connect redistribution patterns 142, formed in different layers, and to electrically connect the connection pad 120P of the semiconductor chip 120 to the redistribution pattern 142. A material of the redistribution via 143 may also be a conductive material such as copper (Cu), aluminum (Al), silver (Ag), tin (Sn), gold (Au), nickel (Ni), lead (Pb), titanium (Ti), or alloys thereof. The redistribution via 143 is also fully filled with the conductive material, or the conductive material is also formed along a wall of a via. Moreover, a tapered shape may also be applied to a shape of the redistribution via 143.

In addition, the passivation layer 181 is a layer for protecting a semiconductor package from an external physical and chemical damage, and may be disposed on the first encapsulant 130. The passivation layer includes an insulating resin and an inorganic filler, but may not include a glass fiber. For example, the passivation layer 181 may be ABF, but is not limited thereto. Alternatively, the passivation layer may be a photoimagable dielectric (PID) material.

The underbump metal layer 160 may be used to improve the connection reliability of the electrical connection metallic member 170. That is, the underbump metal layer 160 may improve board level reliability of the semiconductor package 100 according to an embodiment. The number of the underbump metal layers 160 may be several tens to several millions. Respective underbump metal layers 160 may be connected to the wiring structure 115 through the redistribution layer 145. The underbump metal layer 160 may be formed by any known metallization method using a metal, but is not limited thereto.

The electrical connection metal 170 physically and/or electrically connects the semiconductor package 100 to an external power source. For example, the semiconductor package 100 may be mounted on a main board of an electronic device through the electrical connection metal 170. The electrical connection metal 170 may be formed of a low melting point metal, for example, tin (Sn) or an alloy including tin (Sn). In more detail, the electrical connection metal may be formed of a solder, or the like. However, this is only an example, and a material of the electrical connection metal is not particularly limited thereto. The electrical connection metal 170 may be a land, a ball, a pin, or the like. The electrical connection metal 170 may include a single layer or a plurality of layers. When the electrical connection metal includes the plurality of layers, the electrical connection metal includes a copper pillar and a solder. When the electrical connection metal includes the single layer, the electrical connection metal includes a tin-silver solder or copper. However, the electrical connection metal is only an example, and the present disclosure is not limited thereto. The number, an interval, a disposition form, and the like, of the electrical connection metal 170 are not particularly limited, but may be sufficiently modified depending on design particulars by those skilled in the art. For example, the electrical connection metal 170 may be provided in an amount of several tens to several thousands according to the number of connection pads 120P, or may be provided in an amount of several tens to several thousands or more or several tens to several thousands or less.

At least one of the electrical connection metal 170 may be disposed in a fan-out region. The fan-out region refers to a region not overlapping a region in which the semiconductor chip 120 is disposed. The fan-out package may have excellent reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be manufactured to have a small thickness, and may have price competitiveness.

Figure 12:
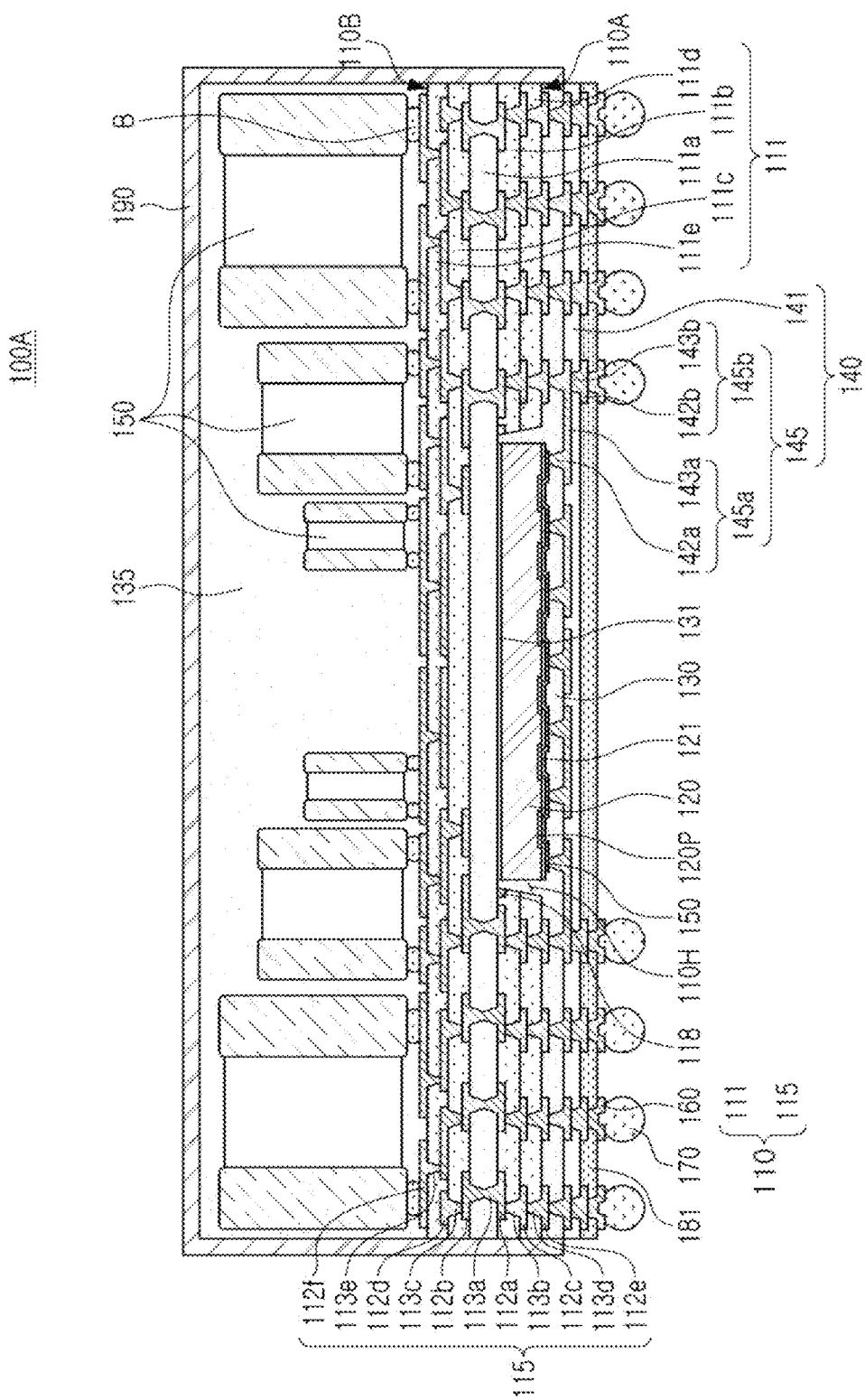
FIG. 12 is a schematic cross-sectional view of a semiconductor package according to an embodiment.

FIG. 12 is a schematic cross-sectional view of a semiconductor package according to an embodiment.

Referring to FIG. 12, a semiconductor package 100A according to an embodiment may be understood to be similar to the structure illustrated in FIGS. 9 to 11, except that a redistribution layer is implemented as a connection structure having a two level redistribution layer. The description of the components of the present disclosure may be referred to the description of the same or similar components of the semiconductor package 100 illustrated in FIGS. 9 to 11, unless specifically explained otherwise.

The semiconductor package 100A according to an embodiment includes a connection structure 140 having a two level redistribution layer 145, in a manner different from a one level redistribution layer. The connection structure 140 includes a first redistribution layer 145a, an insulating layer 141 covering the second redistribution layer 145b, and a second redistribution layer 145b disposed on the insulating layer 141 and connected to the first redistribution layer 145a.

The first redistribution layer 145a includes a first redistribution pattern 142a disposed in a surface of the first encapsulant 130, and a first redistribution via 143a connected to the first redistribution pattern 142a and passing through a portion of the first encapsulant 130. The second redistribution layer 145b includes a second redistribution pattern 142b disposed on a surface of the insulating layer 141, and a second redistribution via 143b connected to the second redistribution pattern 142b and passing through a portion of the insulating layer 141. The first and second redistribution layers 145 and 145b may be formed by a printed circuit board process using a laser drilling process. However, while the first redistribution layer 145a is formed using the printed circuit board process, the second redistribution layer 145b may be formed using a photolithography process. For example, the insulating layer 141 may be formed of PID. In this case, a fine pitch may be introduced through a photovia, so tens to millions of connection pads 120P of the semiconductor chip 120 may be effectively redistributed.

In a manner similar to an embodiment described above, the first redistribution via 143a may include a first via electrically connected to a redistribution capping layer 125 of the semiconductor chip 120 and a second via connected to a portion of the wiring structure 115, exposed to the first surface 110A.

The redistribution capping layer 125 is connected to a region of the connection pad 120P and extending to the protective insulating film 121. The redistribution capping layer 125 may have a wiring structure protruding from the first surface 110A of the frame 110, that is, a surface substantially coplanar with a surface of a protruding wiring pattern 112e.

As described above, the redistribution layer 145 is configured to redistribute a connection pad 120P of the semiconductor chip 120, is connected to the wiring structure 115 of the frame 110, and provides a connection region for the electrical connection metal 170.

Figure 13:
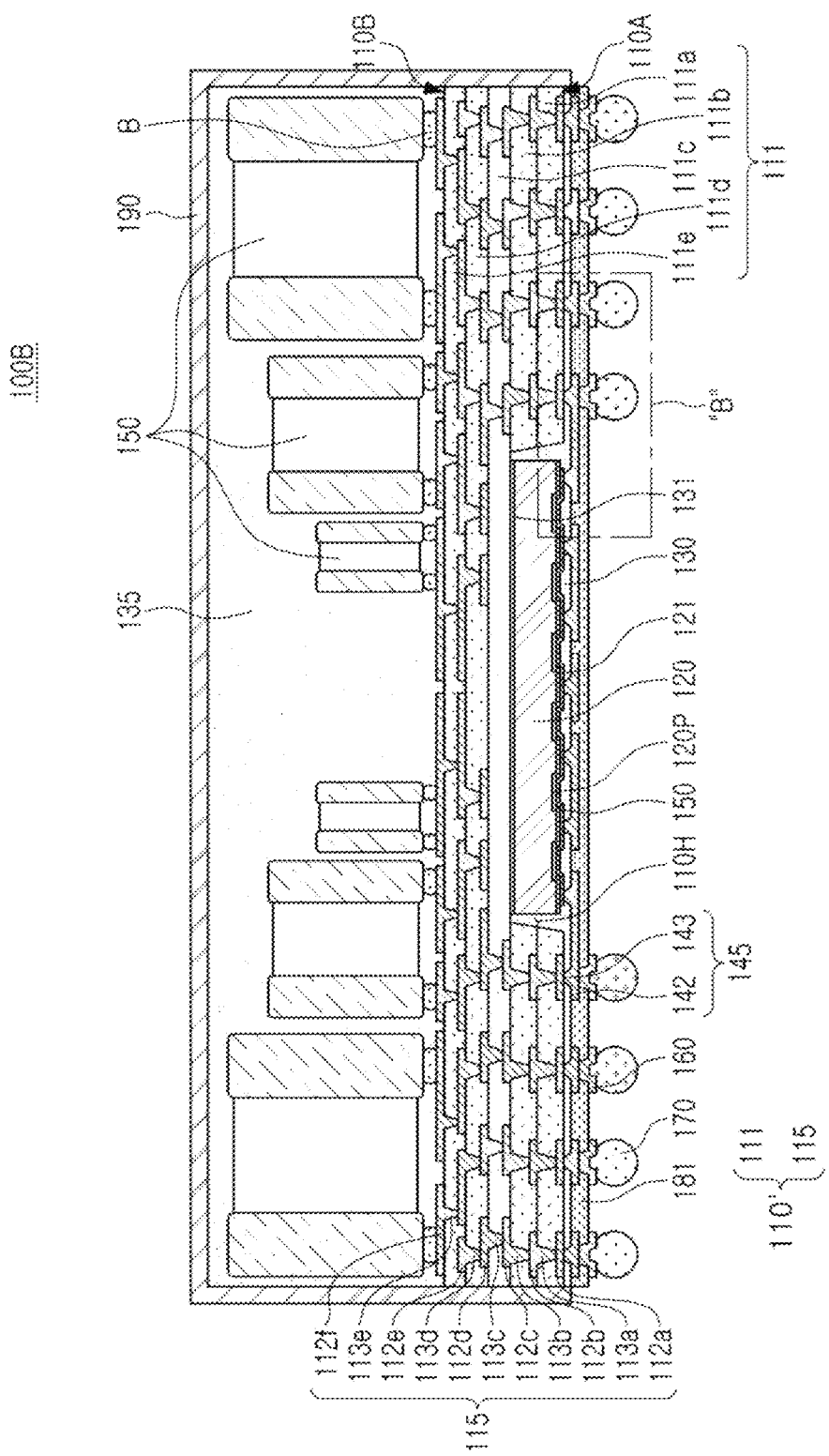
FIG. 13 is a schematic cross-sectional view of a semiconductor package according to an embodiment.

FIG. 13 is a schematic cross-sectional view of a semiconductor package according to an embodiment.

Referring to FIG. 13, a semiconductor package 100B according to an embodiment may be understood to be similar to the structure illustrated in FIGS. 9 to 11, except for a shape of a wiring structure 115 of the frame 110'. The description of the components of the present disclosure may be referred to the description of the same or similar components of the semiconductor package 100 illustrated in FIGS. 9 to 11, unless specifically explained otherwise.

The frame 110', employed in an embodiment, includes an insulating member 111 and a wiring structure 115, having a shape different from those of the frame 110 according to a previous embodiment.

In detail, the insulating member 111 includes first to fifth insulating layers 111a to 111e, sequentially stacked, the recess portion 110H has a structure obtained by forming a cavity in the first and second insulating layers 111a and 111b, and a bottom surface of the recess portion 110H may be provided by one side of the third insulating layer 111c.

The wiring structure 115 includes a first wiring pattern 112a embedded in a lower surface of the first insulating layer 111a and connected to the redistribution layer 145, a second wiring pattern 112b disposed on an upper surface of the first insulating layer 111a, a third wiring pattern 112c disposed on an upper surface of the second insulating layer 111b, a fourth wiring pattern 112 disposed on an upper surface of the third insulating layer 111c, a fifth wiring pattern 112e disposed on an upper surface of the fourth insulating layer 111d, and a sixth wiring pattern 112f disposed on an upper surface of the fifth insulating layer 111e.

Moreover, the wiring structure 115 may include a first wiring via 113a connecting the first and second wiring patterns 112a and 112b while passing through the first insulating layer 111a, a second wiring via 113b connecting the second and third wiring patterns 112b and 112c while passing through the second insulating layer 111b, a third wiring via 113c connecting the third and fourth wiring patterns 112c and 112d while passing through the third insulating layer 111c, a fourth wiring via 113d connecting the fourth and fifth wiring patterns 112d and 112e while passing through the fourth insulating layer 111d, and a fifth wiring via 113e connecting the fifth and sixth wiring patterns 112e and 112f while passing through the fifth insulating layer 111e.

Since the frame 110', employed in an embodiment, has the larger number of first to sixth wiring patterns 112a, 112b, 112c, 112d, 112e, and 112f, the first redistribution layer 145 may be provided as, for example, a single layer to be more simplified.

In an embodiment, the first wiring pattern 112a may be recessed inwardly of the first insulating layer 111a. As described above, when the first wiring pattern 112a is recessed inwardly of the first insulating layer 111a and a step is provided between a lower surface of the first insulating layer 111a and a lower surface of the first wiring pattern 112a, the first wiring pattern 112a may be prevented from being contaminated by bleeding of a formation material of the first encapsulant 130.

As described above, a first wiring pattern 112a, located in the first surface 110A, among the plurality of wiring patterns, may be embedded in the first insulating layer 112, provided to the first surface 110A, among the plurality of insulating layers.

Figure 14:
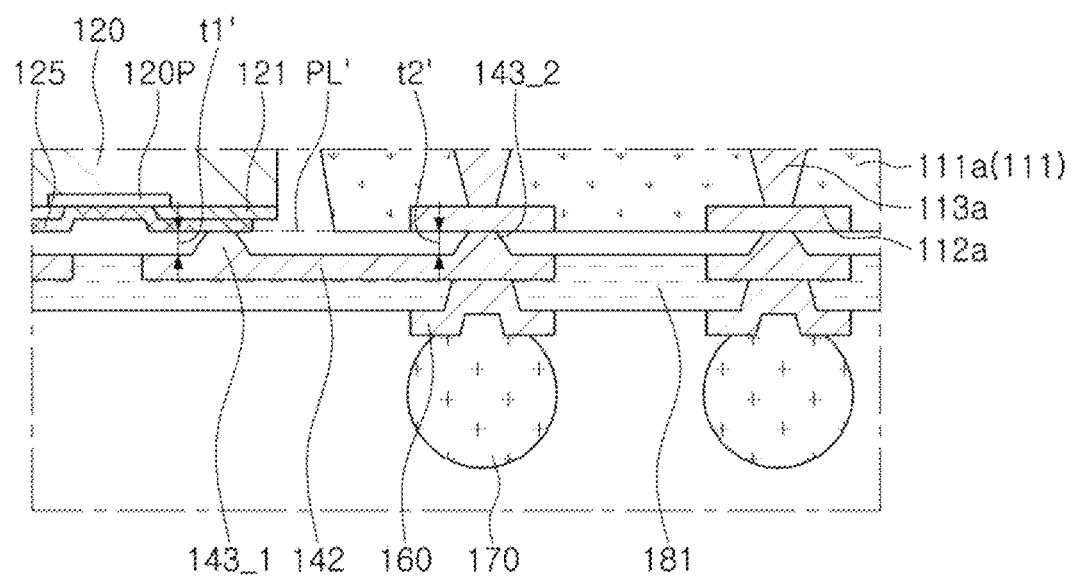
FIG. 14 is an enlarged cross-sectional view illustrating region "B" of the semiconductor package of FIG. 13.

FIG. 14 is an enlarged cross-sectional view illustrating region "B" of the semiconductor package of FIG. 13. In detail, as illustrated in FIG. 14, a portion of the wiring structure 115, exposed to the first surface 110A, may be a first wiring pattern 112a.

A surface PL' of the first wiring pattern 112a is substantially the same level as a surface of the redistribution capping layer 125 of the semiconductor chip 120. In one embodiment, the first via 143_1 may be directly connected the extending portion of the redistribution capping layer 125 disposed directly on the protective insulating film 121. In this case, a height t1' of the first via 143_1 connected to the redistribution capping layer 125 may be substantially the same as a height t2' of the second via 143_2 connected to the first wiring pattern 112a. Thus, as a first encapsulant 130 is processed (for example, a laser drilling process) to a predetermined depth for formation of the redistribution layer 145, holes for formation of desired first and second vias 143_1 and 143_2) may be easily formed.

Figure 15:
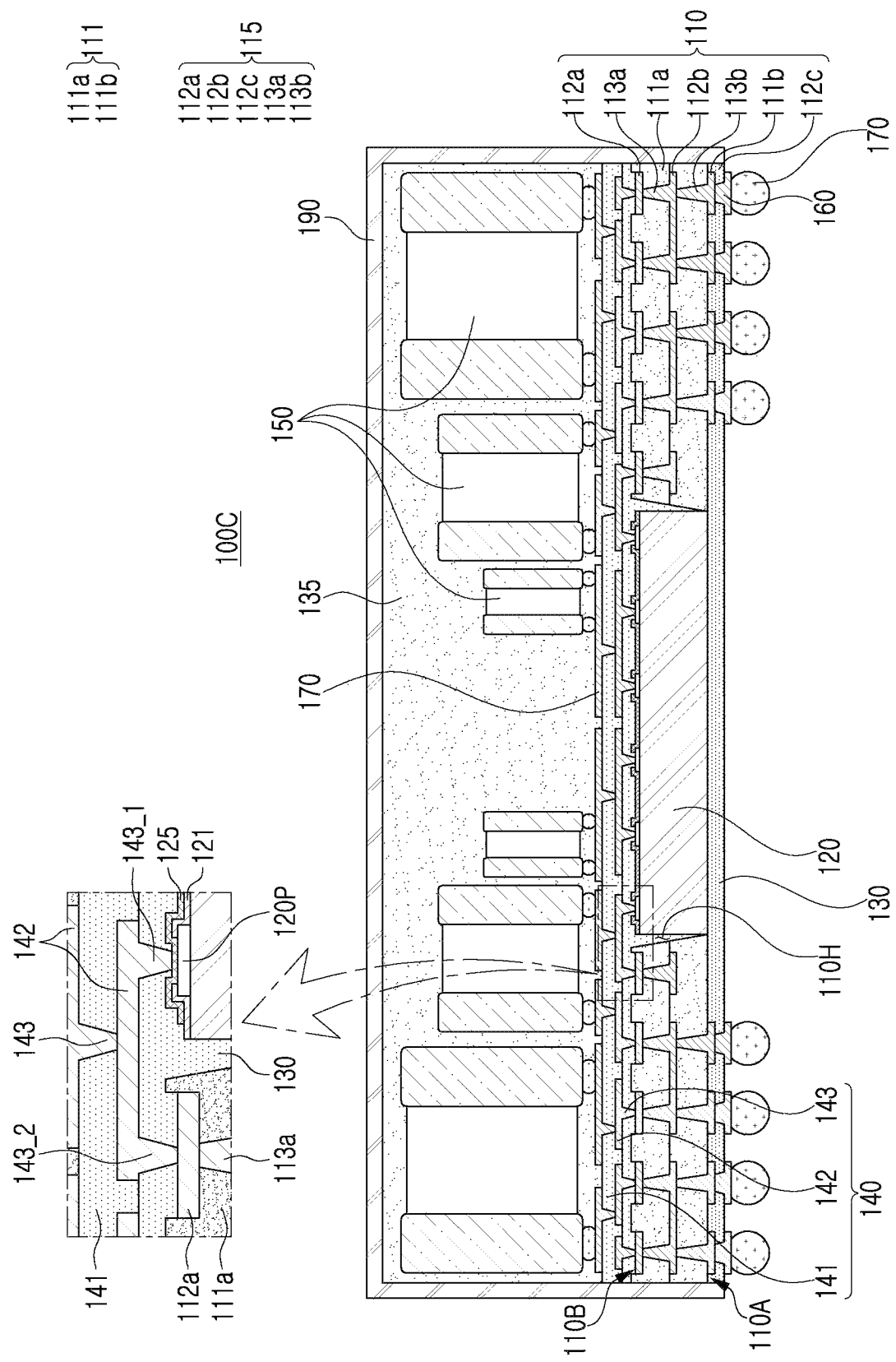
FIG. 15 is a schematic cross-sectional view of a semiconductor package according to an embodiment.

FIG. 15 is a schematic cross-sectional view of a semiconductor package according to an embodiment.

Referring to FIG. 15, a semiconductor package 100C according to an embodiment may be understood to be similar to the structure illustrated in FIGS. 9 to 11, except for a shape of a frame 110 and an active surface of a semiconductor chip 120 disposed to oppose a plurality of passive components. The description of the components of the present disclosure may refer to the description of the same or similar components of the semiconductor package 100 illustrated in FIGS. 9 to 11, unless specifically explained otherwise.

The frame 110 includes a wiring structure 115 connected to the first surface 110A and the second surface 110B, and the semiconductor package 100C may include a plurality of electrical connection metallic bodies 170 disposed on the first surface 110A of the frame 110. The plurality of electrical connection metallic bodies 170 may be connected to the wiring structure 115 (in detail, a third wiring pattern 112c). In an embodiment, an UBM layer 160 may be additionally disposed between the electrical connection metallic body 170 and the wiring structure 115.

The frame 110 may include an insulating member 111 in which a plurality of insulating layers 111a and 111b are stacked. The wiring structure 115 may include a plurality of wiring patterns 112a, 112b, and 112c, formed in the plurality of insulating layers 111a and 111b, and a plurality of wiring vias 113a and 113b passing through the plurality of insulating layers 111a and 111b and connecting the plurality of wiring patterns 112a, 112b, and 112c to each other.

The frame 110 has a recess 110H open toward an upper portion of the recess, and the semiconductor chip 120 may be disposed in the recess 110H to allow the active surface thereof to face the open upper portion of the recess. A redistribution layer 140 is disposed on the second surface 110B of the frame 110 and the active surface of the semiconductor chip 120 to be electrically connected to the wiring structure 115 and a connection pad 120P.

In a similar manner to embodiments described above, the semiconductor chip 120 may include a protective insulating film 121 disposed in the active surface and opening a region of the connection pad 120P, and a redistribution capping layer 125 connected to a region of the connection pad 120P and extended from the protective insulating film 121.

The first encapsulant 130 may be disposed to cover the active surface of the semiconductor chip 120 and the second surface 110B of the frame 110. A portion of the first encapsulant 130, located in the active surface of the semiconductor chip 120, may expose a region of the redistribution capping layer 125, and the first via 143_1 may be directly connected to the redistribution capping layer 125 through the exposed region. Through the connection described above, the first via 143_1 of the redistribution layer 145 may be electrically connected to the connection pad 120P of the semiconductor chip 120.

As described above, a first wiring pattern 112a, located in the second surface 110B, of the plurality of wiring patterns, may be embedded in the first insulating layer 111a provided to the second surface 110B. In detail, as illustrated in an enlarged view of FIG. 15, a portion of the wiring structure 115, exposed to the second surface 110B, may be a first wiring pattern 112a.

The first wiring pattern 112a may have a surface PL" substantially planar with a surface of the redistribution capping layer 125 of the semiconductor chip 120. In this case, a height t1" of the first via 143_1 connected to the redistribution capping layer 125 may be substantially the same as a height t2" of the second via 143_2 connected to the first wiring pattern 112a.

Thus, as a first encapsulant 130 is processed (for example, in a laser drilling process) to a predetermined depth for formation of the redistribution layer 145, holes for formation of desired first and second vias 143_1 and 143_2) may be easily formed.

As set forth above, according to an embodiment in the present disclosure, a redistribution capping layer is provided to an inactive surface of a semiconductor chip in advance, so a redistribution layer may be formed on a surface of an encapsulant covering a semiconductor chip and a frame using a simple laser beam processing process.

While exemplary embodiments have been shown and described above, it will be apparent to those skilled in the art that modifications and variations could be made without departing from the scope of the present invention as defined by the appended claims.

What is claimed is:

1. A semiconductor package, comprising:
a frame having a first surface and a second surface opposing each other, including an insulating member and a wiring structure disposed in the insulating member and connecting the first and second surfaces to each other, and having a recess portion open toward the first surface;
a semiconductor chip disposed in the recess portion and having a connection pad;
an encapsulant sealing the semiconductor chip in the recess portion, and covering the first surface of the frame; and
a redistribution layer disposed on a surface of the encapsulant, and having a first via connected to the connection pad of the semiconductor chip and a second via connected to a portion of the wiring structure, exposed from the first surface,
wherein the semiconductor chip includes a protective insulating film having an opening exposing a region of the connection pad, and a redistribution capping layer connected to the region of the connection pad and extending onto the protective insulating film,
the first via is connected to an extending portion of the redistribution capping layer on the protective insulating film, and
the protective insulating film is spaced apart from the frame.

2. The semiconductor package of claim 1, wherein a surface of the redistribution capping layer is substantially the same level as a surface of the portion of the wiring structure, exposed from the first surface.

3. The semiconductor package of claim 1, wherein the first via and the second via have substantially the same height.

4. The semiconductor package of claim 1, wherein the portion of the wiring structure, exposed from the first surface, has a structure protruding from the first surface.

5. The semiconductor package of claim 1, wherein the portion of the wiring structure, exposed from the first surface, is partially embedded in the insulating member.

6. The semiconductor package of claim 1, wherein the connection pad includes aluminum (Al), and the redistribution capping layer includes copper (Cu).

7. The semiconductor package of claim 1, further comprising an insulating layer disposed on a surface of the encapsulant to cover the redistribution layer, and an additional redistribution layer having a redistribution via disposed in the insulating layer and connected to the redistribution layer.

8. The semiconductor package of claim 1, further comprising a plurality of passive components disposed on the second surface of the frame, and connected to the wiring structure.

9. The semiconductor package of claim 8, further comprising an additional encapsulant disposed on the second surface of the frame to seal the plurality of passive components.

10. The semiconductor package of claim 9, further comprising a shielding metal layer disposed on a surface of the additional encapsulant and extending onto a side surface of the frame.

11. The semiconductor package of claim 1, further comprising a bonding layer disposed between the semiconductor chip and the bottom surface of the recess portion.

12. The semiconductor package of claim 1, further comprising a stopper layer embedded in the insulating member and disposed on a level of the bottom surface of the recess portion.

13. The semiconductor package of claim 1, wherein the first and second vias penetrate into the encapsulant.

14. The semiconductor package of claim 1, wherein the extending portion of the redistribution capping layer is disposed directly on the protective insulating film.

15. The semiconductor package of claim 1, wherein the first via and the connection pad do not overlap with each other in stacking direction of wiring layers of the wiring structure.

16. The semiconductor package of claim 1, wherein the redistribution capping layer is disposed in a region of the semiconductor chip, so that a side surface of the redistribution capping layer, extending from the protective insulating film, is covered by the encapsulant.

17. A semiconductor package, comprising:
a frame having a first surface and a second surface opposing each other, including a plurality of insulating layers, a plurality of wiring patterns disposed in the plurality of insulating layers, respectively, and a plurality of wiring vias connecting the plurality of wiring patterns while passing through the plurality of insulating layers, and having a recess portion open to the first surface;
a semiconductor chip disposed in the recess portion and having a connection pad;
a first encapsulant sealing the semiconductor chip disposed in the recess portion, and covering the first surface of the frame;
a redistribution layer disposed on a surface of the first encapsulant, and having a first via connected to a connection pad of the semiconductor chip and a second via connected to a wiring pattern located on the first surface, among the plurality of wiring patterns;
a plurality of passive components disposed on the second surface of the frame, and connected to the plurality of wiring patterns; and
a second encapsulant disposed on the second surface of the frame to seal the plurality of passive components,
wherein the semiconductor chip includes a protective insulating film having an opening exposing a region of the connection pad, and a redistribution capping layer connected to the region of the connection pad and extending onto the protective insulating film,
the first via is connected to an extending portion of the redistribution capping layer on the protective insulating film,
the first via and the second via have substantially the same height, and the protective insulating film is spaced apart from the frame.

18. The semiconductor package of claim 17, wherein a surface of the redistribution capping layer is substantially with the same levels as a surface of a wiring pattern located on the first surface, among the plurality of wiring patterns.

19. The semiconductor package of claim 17, wherein a wiring pattern, located on the first surface, among the plurality of wiring patterns, has a structure protruding from the first surface.

20. The semiconductor package of claim 17, wherein a wiring pattern, located on the first surface, among the plurality of wiring patterns, is embedded in an insulating layer providing the first surface, among the plurality of insulating layers.

21. The semiconductor package of claim 17, further comprising an additional insulating layer disposed on a surface of the first encapsulant to cover the redistribution layer, and an additional redistribution layer having a redistribution via disposed in the additional insulating layer and connected to the redistribution layer.

22. The semiconductor package of claim 17, wherein the redistribution capping layer is disposed in a region of the semiconductor chip, so that a side surface of the redistribution capping layer, extending from the protective insulating film, is covered by the first encapsulant.

* * * * *